United States Patent [19]
Yi

[11] Patent Number: 5,426,364
[45] Date of Patent: Jun. 20, 1995

[54] LINEAR HALL CIRCUIT FOR MEASURING MAGNETIC FIELD STRENGTH

[76] Inventor: Mingguang Yi, 401-5, Building 9, Anwai Anhua Xili Sanqu, Chaoyang District, Beijing, China

[21] Appl. No.: 98,724

[22] Filed: Jul. 29, 1993

[30] Foreign Application Priority Data

Aug. 8, 1992 [CN] China .................. 92109150.8

[51] Int. Cl.$^6$ .................. G01R 33/06; G01N 27/72
[52] U.S. Cl. .................. 324/251; 324/225; 338/32 H; 327/511
[58] Field of Search .................. 324/224, 225, 117 H, 324/251; 338/32 H; 307/309, 311

[56] References Cited

U.S. PATENT DOCUMENTS

| | | | |
|---|---|---|---|
| 3,416,010 | 12/1968 | Kuehnlein et al. | 324/251 |
| 4,449,081 | 5/1984 | Doemen | 324/251 X |
| 4,646,014 | 2/1987 | Eulenberg | 324/251 |
| 4,823,075 | 4/1989 | Alley | 324/251 X |

FOREIGN PATENT DOCUMENTS 0771582 10/1980 U.S.S.R. .................. 324/251

OTHER PUBLICATIONS

James Thompson, Magnetic field Measuring Circuit, European Patent Application 0357013, Mar. 1990.
Chinese Patent Application 90106846.2, Jan. 9, 1991.

Primary Examiner—Sandra L. O'Shea
Assistant Examiner—Jay M. Patidar
Attorney, Agent, or Firm—Longacre & White

[57] ABSTRACT

A linear Hall circuit that utilizes a single-ended output Hall current to sense a magnetic field so as to measure the magnetic field strength. A first operational amplifier configured as a transresistance amplifier converts the output Hall current of a Hall device to an output voltage. To avoid inducing a bias-based nonlinearity in the output Hall current, a second operational amplifier, having two resistors connected to both bias electrodes of the Hall device, respectively, is used to inject feedback Hall currents in them. The average value of the bias currents is then kept from varying with the output Hall current of the Hall device.

8 Claims, 4 Drawing Sheets

LINEAR HALL CIRCUIT FOR MEASURING MAGNETIC FIELD STRENGTH

FIELD OF THE INVENTION

The present invention relates to a magnetic sensing circuit for measuring magnetic field, and more specifically, to a Hall circuit for measuring magnetic field strength.

BACKGROUND OF THE INVENTION

Recently, the study of Hall device techniques has been developed, resulting in the discovery of the current mode of Hall device. For example, as shown in FIG. 1, European patent No. EP0357013 discloses a circuit which employs a method of injecting a current into a Hall axis of a Hall device (HD). In this circuit, the injected current is equal to the output Hall current $Ih_o$ and is then converted to an output voltage indicating the magnetic field strength so that the magnetic field can be measured. However, it is due to the presence of the Hall current that the currents at the two bias contacts of the Hall device may not be equal to each other and may vary with changes in the external magnetic field. This leads to nonlinearity between the Hall current and the magnetic field to be measured and consequently results in inaccurate measurements of the magnetic field. Furthermore, there also is another problem which affects measurement in the circuit. The zero-point of the output voltage thereof is at a value of a portion of the voltage of the power supply divided by the internal resistance of the Hall device and the bias resistors. Therefore, any discreptancy in the internal resistance of the Hall device and any shift of temperature will result in the offset of the output zero-point of the circuit. The symmetrical bias solution presented by Chinese Patent Application. No. 90106846.2 prevents the sum of the currents in the two bias contacts of the Hall device from changing with that of magnetic field so as to provide a linearity between the Hall current and the magnetic field to be measured. The output zero-point of the circuit takes the middle potential of the power-supply voltage of the circuit, and is independent of the internal resistance of the Hall device. Thus the circuit is kept relatively steady. However, in this circuit, since the output zero-point is a floating point, when positive and negative dual-power supplies are employed, any change of the voltage of the power supplies will cause a shift in the output zero-point accordingly.

SUMMARY OF THE INVENTION

Accordingly, it is an object of the present invention to provide a Hall circuit which has a steady reference zero-point, e.g. ground potential and a good linearity between the Hall current and the magnetic field to be measured so as to present an accurate magnetic field measurement.

According to the invention, a Hall circuit for measuring magnetic field comprises a Hall device and a bias means connected to a first and a second bias contacts of the Hall device, wherein a current injection means is connected to both bias contacts of the Hall device to force the output of the Hall axis of the Hall device to be kept at a predetermined potential, which wilt then be used as an output zero-point of the circuit, an amplifier means is connected to the output of the Hall axis of the Hall device, said amplifier means converts the Hall current output from the Hall device into the output voltage of the circuit during the measurement of the magnetic field to indicate the measurement of the magnetic field.

BRIEF DESCRIPTION OF THE DRAWINGS

In the following the invention will be described in detail in connection with examples shown in the accompanying drawings, in which.

DETAILED DESCRIPTION OF PREFERRED EMBODIMENTS

Figure 1:
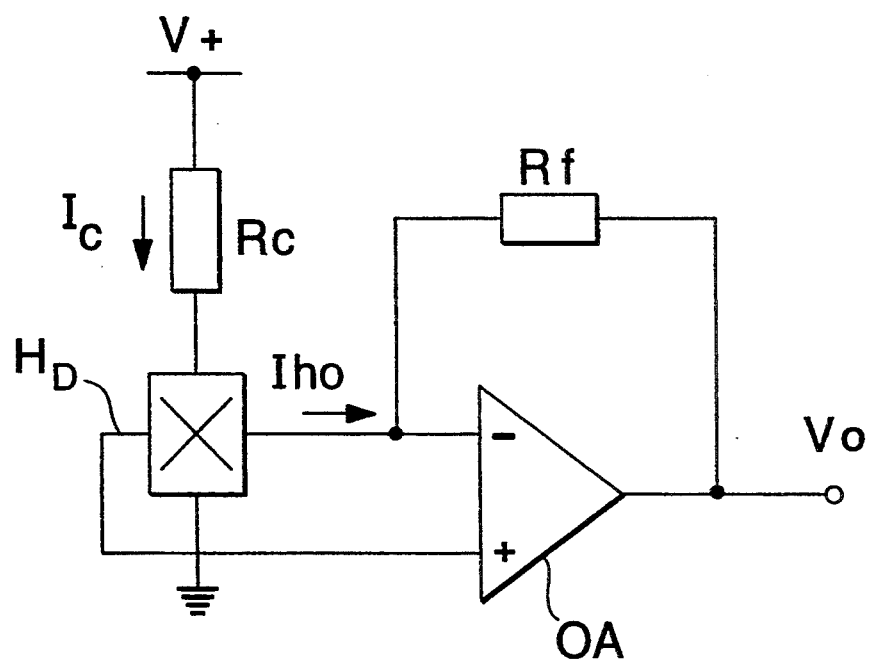
FIG. 1 shows a circuit arrangement of the prior art.
Figure 2:
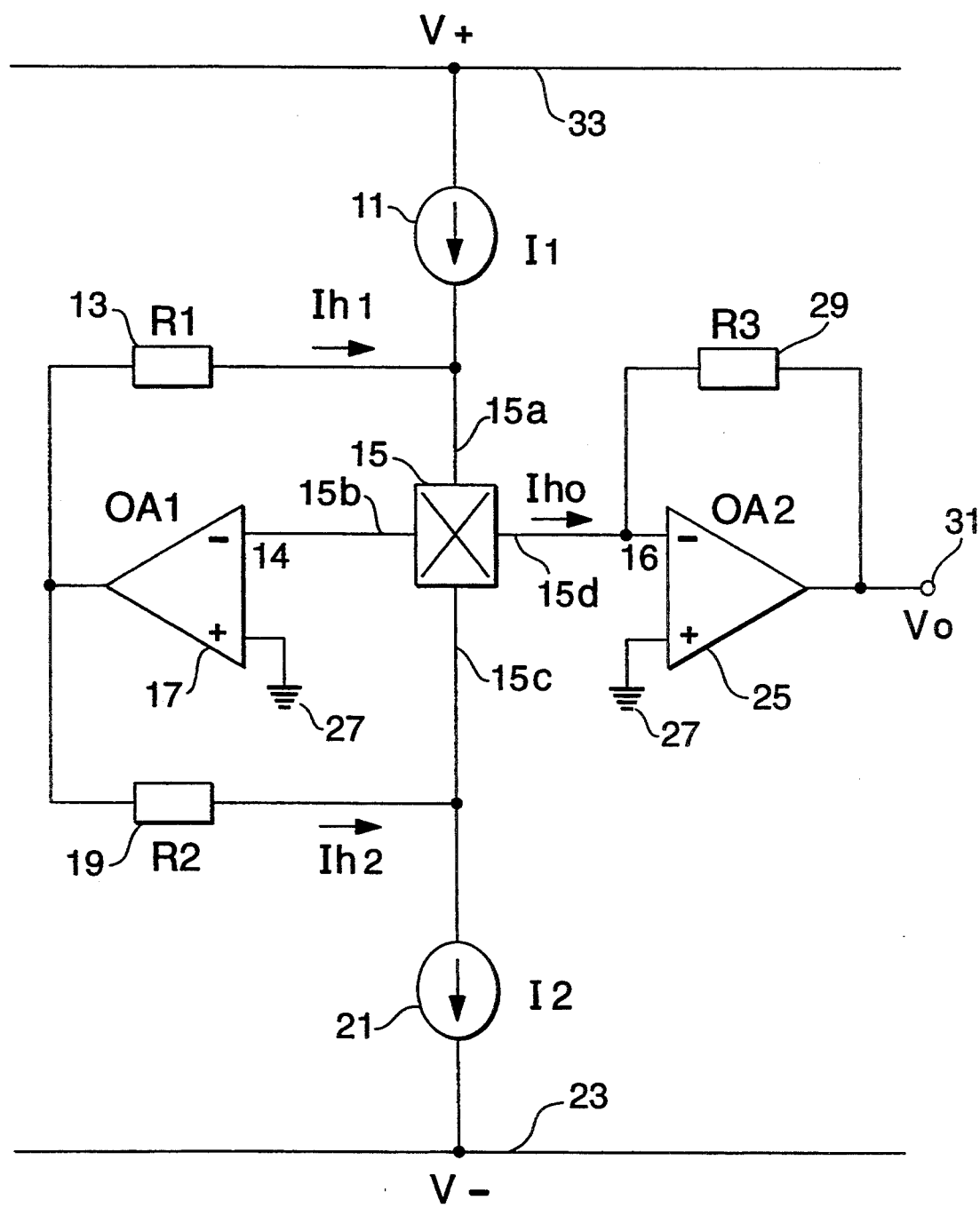
FIG. 2 is a diagram of the Hall circuit according to the invention.
Figure 3:
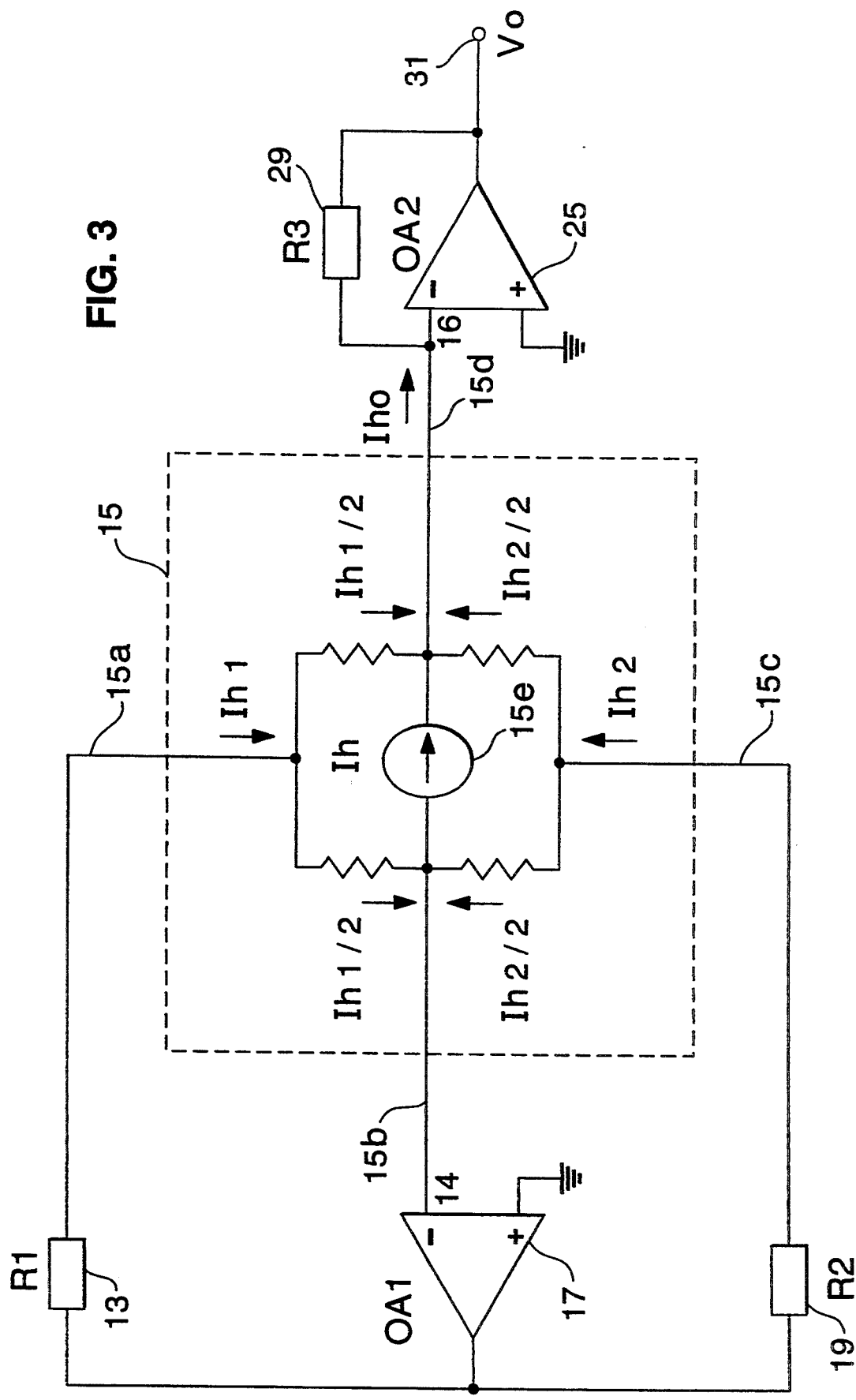
FIG. 3 shows an equivalent circuit of FIG. 2.

FIG. 2 presents a preferred embodiment of the Hall circuit according to the invention. The Hall circuit of the invention comprises a Hall device as shown by the box 15 having a first and a second bias contacts 15a and 15c connected to a first and second current sources ($I_1$) 11 and ($I_2$) 21 respectively, and a first and a second Hall current contacts 15b and 15d connected to the negative inputs 14 and 16 of a first and a second operational amplifiers (OA1 and OA2) 17 and 25 respectively. The positive inputs of both amplifiers are connected to the reference ground 27 so that the output voltage $V_O$ at the output 31 of the second operational amplifier 25 takes this reference ground 27 as its ground. Since there is no current at the reference ground 27, this point can be used as a setting or adjusting terminal for the zero-point of the output without involving any additional offset. The output of the first operational amplifier 17 is connected to both first and second bias contacts 15a and 15c of the Hall device 15 via feedback resistors 13 and 19 (R1 and R2) respectively. Therefore, the output of the first operational amplifier 17 injects the feedback currents $Ih_1$ and $Ih_2$ into the first and second bias contacts 15a and 15c of the Hall device 15 via the resistors R1 and R2 when a magnetic field to be measured induces a Hall current Ih in the Hall device as shown in FIG. 3 by the Hall current source 15e. This negative feedback connection will keep the first Hall contact 15b at the ground potential.

When the feedback resistors R1 and R2 are equal, the injected currents $Ih_1$ and $Ih_2$ fed to the first and second bias contacts 15a and 15c of the Hall device 15 are equal to each other too. Therefore, the sum of the currents of both bias contacts 15a and 15c of the Hall device 15 is independent of the magnetic field so that the linearity between the Hall current Ih and the magnetic field to be measured is ensured. Since both $Ih_1$ and $Ih_2$ are equal to Ih, (they may be referred to as "feedback Hall current") and have a linear relation to the magnetic field to be measured, consequently the output Hall current $Ih_o$ of the Hall device 15 as well as the output voltage $V_O$ of the circuit also have a linear relation to the magnetic field being measured. In the invention, the bias current sources may be replaced by temperature-dependent current sources or thermal resistors, and this may achieve temperature compensation easily.

The response of the circuit of FIG. 2 to the magnetic field will be further described in the light of FIG. 3. FIG. 3 is a simplified diagram of the circuit of FIG. 2, wherein the Hall device is represented by an equivalent bridge with four equal arms as shown within dashed lines, the Hall current generated under the effect of a magnetic field is represented by a Hall current source Ih (15e) on the diagonal line of the Hall axis. Furthermore, the bias current sources $I_1$ and $I_2$ are omitted in FIG. 3 for clarity because they do not affect the signal amplifying operation in the circuit. It is obvious in the light of FIG. 3 that since the Hall device is in fact a bridge with four equal arms, the feedback current $Ih_1$ is equally divided between the two upper arms of the bridge. Likewise, $Ih_2$ is equally divided between the two lower arms of the bridge. As there is no current coming in and going out of the Hall contact 15b, the equality $(Ih_1 + Ih_2)/2 = Ih$ is established. Therefore, the output Hall current $Ih_o$ at the second Hall contact 15d will be:

$$I_{out} = Ih_1 + Ih_2 = 2Ih$$

This output Hall current $Ih_o$ is converted into the final output voltage $V_O$ by the current-voltage converter composed of the second operational amplifier 25 and the feedback 29 to indicate the magnetic field strength.

Figure 4:
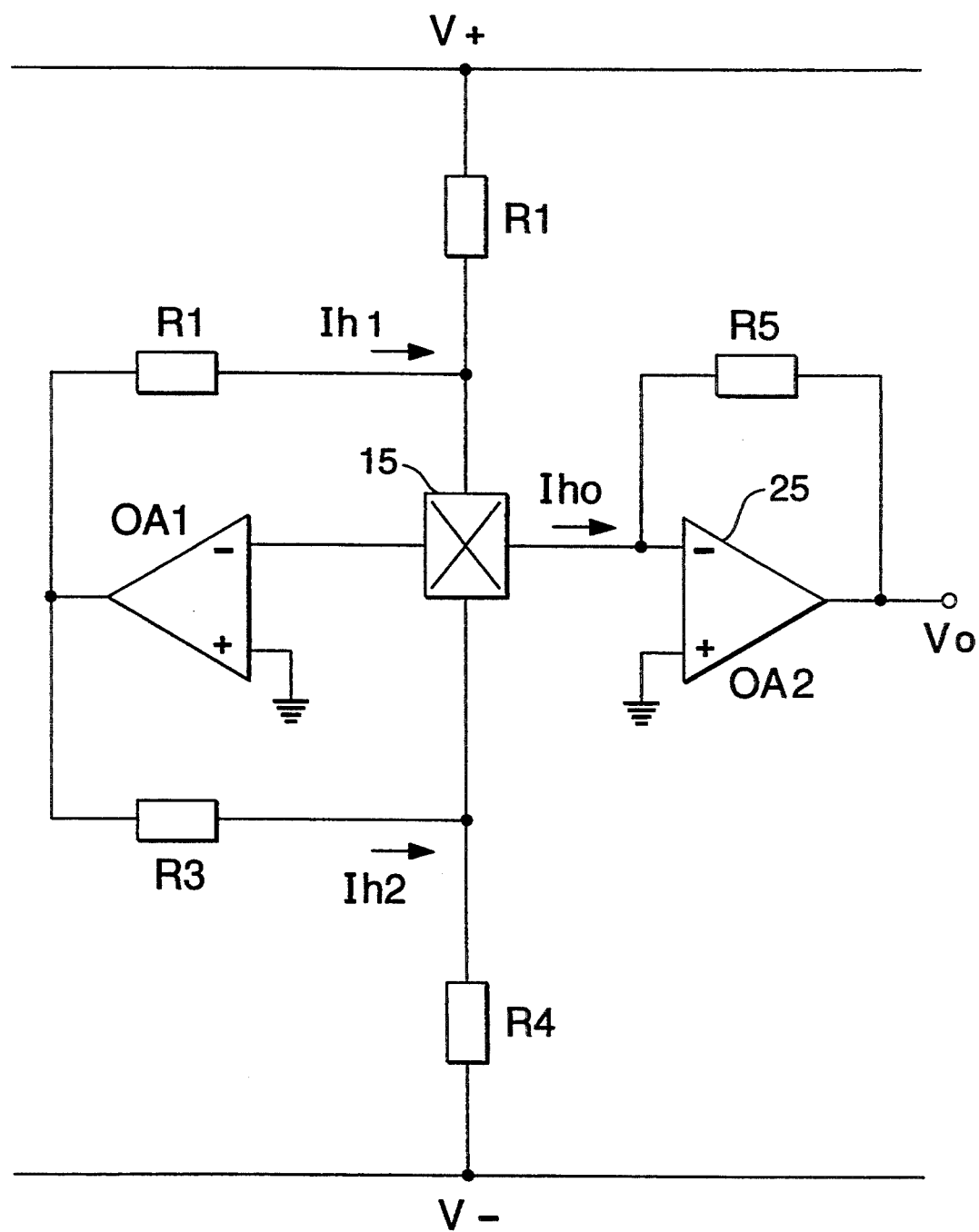
FIG. 4 shows an embodiment of the Hall circuit according to the present invention.

FIG. 4 shows a real circuit according to the principle of the invention, where the bias current sources I1 and I2 of FIG. 2 are replaced with two resistors R1, R4 connected to the power supplies V+ and V− respectively, and wherein the parameters of each element in the circuit are as follows: $R1 = R2 = R3 = R4 = 7.5$ K$\Omega$; $R5 = 100$ K$\Omega$; the first and second operational amplifiers 17 and 25 are μA 741 respectively; the Hall device 15 is a GaAs epitaxial device with a sensitivity of 0.4/Tesla; voltage sources are $V_+ = +15$ V, $V_{31} = -15$ V respectively; the sensitivity of the output voltage $V_O$ in response to the magnetic field is about 80 V/Tesla.

Thus, the present invention provides a Hall circuit with a steady reference zero-point and an advantageous linearity between the output voltage and the magnetic field to be sensed.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What we claim is:

1. A circuit for measuring magnetic field, comprising:
   a Hall device (15) having first and second bias contacts (15a, 15c) and first and second Hall contacts (15b, 15d);
   bias means (11, 21) connected to said first and second bias contacts (15a, 15c) of said Hall device (15);
   a first amplifier means (13, 17, 19, 27) having an inverted input (14) connected to said first Hall contact (15b) of said Hall device (15) and an output connected to said first and second bias contacts (15a, 15c) for injecting a first and second feedback Hall current (Ih1, Ih2) respectively to said first and second bias contacts (15a, 15c) of said Hall device (15);
   a second amplifier means (25, 27, 29) having an inverted input (16) connected to said second Hall contact (15d) of said Hall device (15) for receiving an output Hall current ($Ih_o$) of said Hall device (15) and for conveying it to an output voltage of said circuit.

2. A circuit according to claim 1, wherein said first and second Hall contacts (15b, 15d) of said Hall device (15) are forced at a common reference ground (27) by means of a feedback circuit configuration of said first and second amplifier means.

3. A circuit according to claim 2, wherein said second amplifier means comprises a transresistance amplifier composed of an operational amplifier (25) and a feedback resistor (29) connected between the second amplifier output (31) and said second amplifier inverting input (16) thereof, and wherein a non-inverting input of said amplifier (25) is connected to said reference ground (27).

4. A circuit according to claim 1, wherein said output Hall current ($Ih_o$) of said Hall device (15) is a substantially linear function of a magnetic field applied to said circuit.

5. A circuit according to claim 1, wherein said first and second feedback Hall currents (Ih1, Ih2) are substantially equal to each other and the sum of said feedback Hall currents are substantially equal to said output Hall current ($Ih_o$) of said Hall device (15).

6. A circuit according to claim 1, wherein said first amplifier means is a transconductance amplifier comprising a first operational amplifier (17) and first and second feedback resistors (13, 19); wherein said inverting input (14) of said operational amplifier (17) is connected to said first Hall contact (15b) of said Hall device (15) and a non-inverting input of said amplifier (17) is connected to said reference ground (27); said first feedback resistor (13) is connected between the output of said operational amplifier (17) and said first bias contact (15a) of said Hall device (15); said second feedback resistor (19) is connected between the output of said operational amplifier (17) and said second bias contact (15c) of said Hall device (15); and said two feedback resistors (13, 19) have substantially the same resistance value.

7. A circuit according to claim 1, wherein said bias means comprises two current sources (I1, I2) which provide substantially equal current values respectively.

8. A circuit according to claim 1, wherein said bias means comprises two resistors (R1, R4) which have substantially equal resistance values respectively.

* * * * *